United States Patent
Reinhold et al.

(10) Patent No.: US 8,298,337 B2
(45) Date of Patent: Oct. 30, 2012

(54) GAS INLET ELEMENT FOR A CVD REACTOR

(75) Inventors: Markus Reinhold, Hilden (DE); Peter Baumann, Aachen (DE); Gerhard Karl Strauch, Aachen (DE)

(73) Assignee: Aixtron, Inc., Sunnyvale, CA (US)

( * ) Notice: Subject to any disclaimer, the term of this patent is extended or adjusted under 35 U.S.C. 154(b) by 1098 days.

(21) Appl. No.: 11/814,913

(22) PCT Filed: Jan. 5, 2006

(86) PCT No.: PCT/EP2006/050048
§ 371 (c)(1),
(2), (4) Date: Aug. 28, 2008

(87) PCT Pub. No.: WO2006/079576
PCT Pub. Date: Aug. 3, 2006

(65) Prior Publication Data
US 2009/0025639 A1    Jan. 29, 2009

(30) Foreign Application Priority Data
Jan. 28, 2005    (DE) .......................... 10 2005 003 984

(51) Int. Cl.
C23C 16/00 (2006.01)
C23C 16/44 (2006.01)
C23C 16/455 (2006.01)
H01L 21/306 (2006.01)

(52) U.S. Cl. .............. 118/715; 156/345.33; 156/345.34; 427/248.1; 427/255.23; 427/255.28

(58) Field of Classification Search .................. 118/715; 156/345.33, 345.34; 427/248.1, 255.23, 427/255.28, 355.394
See application file for complete search history.

(56) References Cited

U.S. PATENT DOCUMENTS

| 5,871,586 | A | 2/1999 | Crawley et al. |
| 6,007,633 | A | 12/1999 | Kitamura et al. |
| 6,086,677 | A * | 7/2000 | Umotoy et al. ............... 118/715 |
| 6,274,495 | B1 * | 8/2001 | Omstead et al. .............. 438/680 |
| 6,508,197 | B1 * | 1/2003 | Omstead et al. .............. 118/715 |
| 7,481,886 | B2 * | 1/2009 | Kato et al. .................... 118/715 |
| 8,080,107 | B2 * | 12/2011 | Kennedy et al. ............. 118/715 |
| 2003/0015291 | A1 | 1/2003 | Lee et al. |
| 2003/0019428 | A1 | 1/2003 | Ku et al. |
| 2007/0107436 | A1 * | 5/2007 | Evulet ............................ 60/776 |
| 2009/0025639 | A1 * | 1/2009 | Reinhold et al. .............. 118/715 |

FOREIGN PATENT DOCUMENTS

| EP | 0687749 A1 | 12/1995 |
| EP | 1252363 B1 | 9/2003 |

OTHER PUBLICATIONS

Aixtron AG, PCT/EP2006/050048, International Search Report and Written Opinion, Aug. 10, 2006, 10pp, ISA/EP, European Patent Office.

* cited by examiner

*Primary Examiner* — Jeffrie R Lund
(74) *Attorney, Agent, or Firm* — Tarek N. Fahmi

(57) ABSTRACT

The invention relates to a gas inlet element (2) for a CVD reactor with a chamber (4), which has a multitude of bottom-side outlet openings (23), via which a process gas introduced into the chamber (4) via edge-side access openings (10) exits into a process chamber (21) of the CVD reactor (1). In order to homogenize the gas composition, the invention provides that at least one mixing chamber arrangement (11, 12, 13) is situated upstream from the access openings (10), and at least two process gases are mixed with one another inside this mixing chamber arrangement.

14 Claims, 3 Drawing Sheets

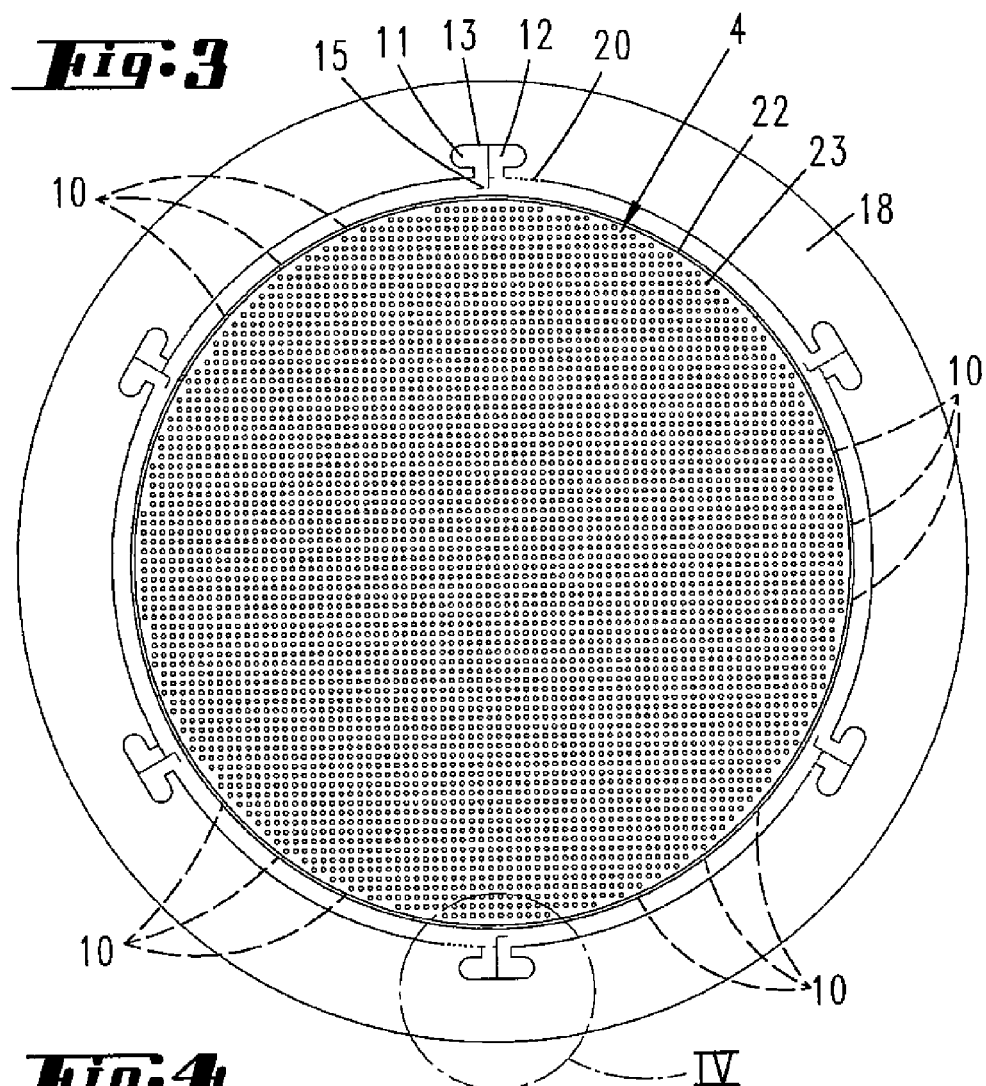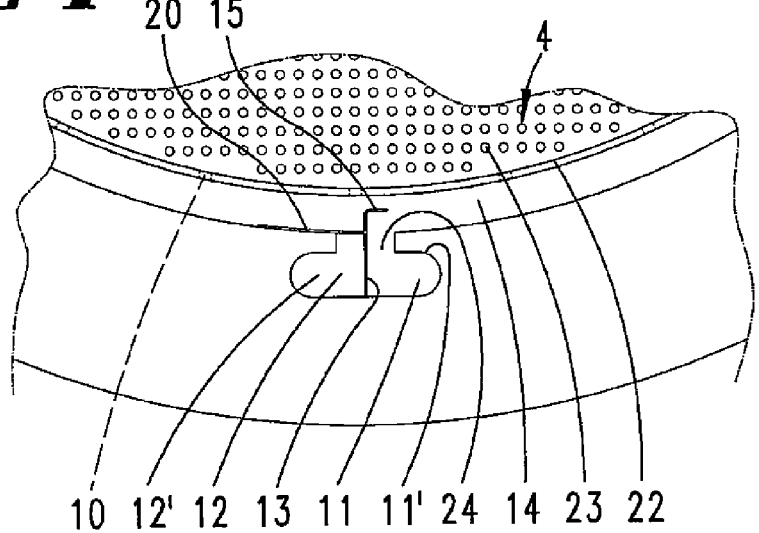

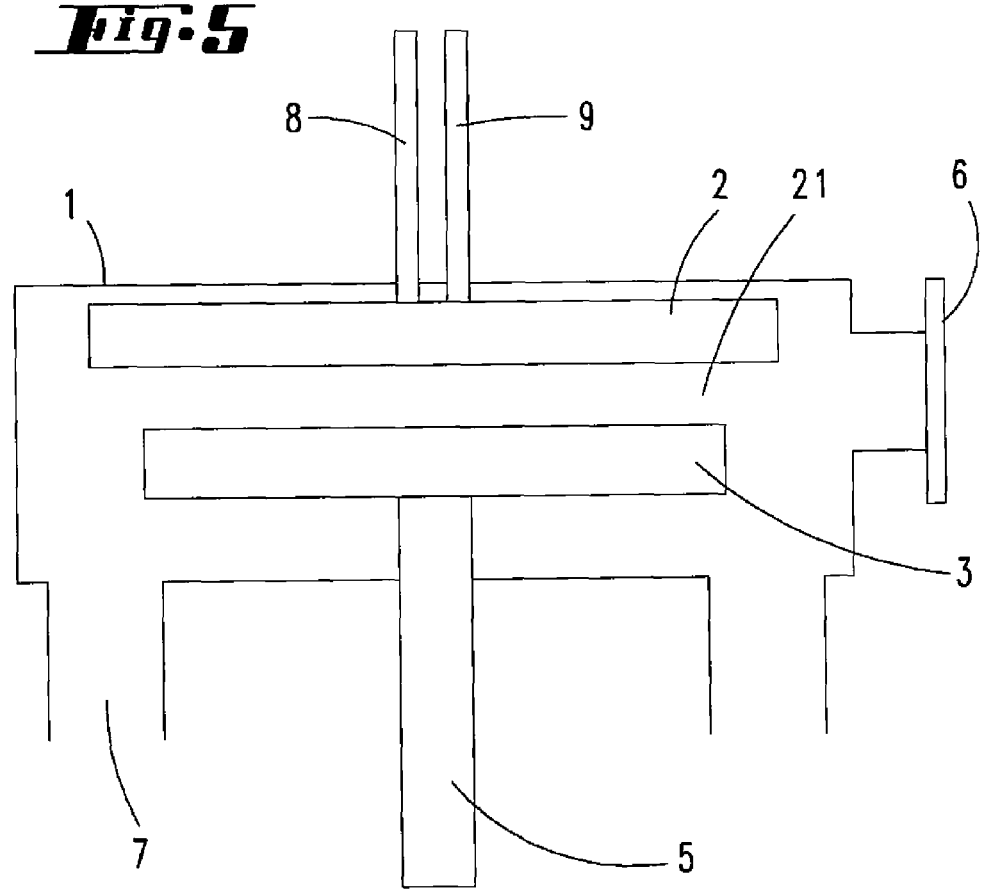
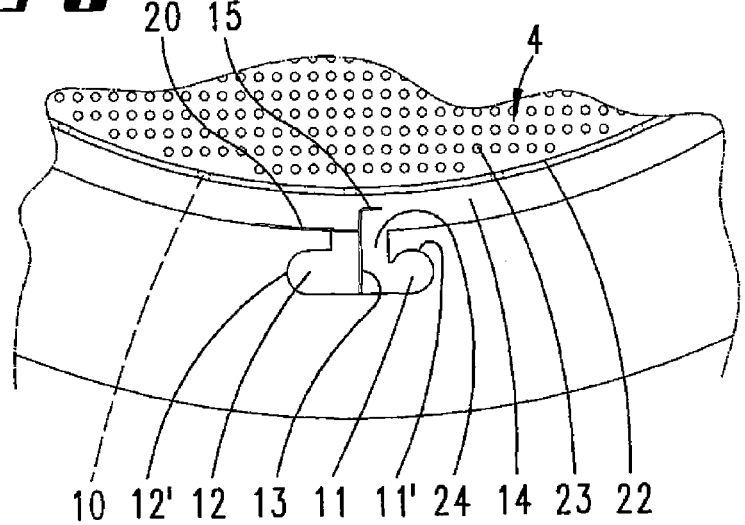

GAS INLET ELEMENT FOR A CVD REACTOR

CROSS REFERENCES TO RELATED APPLICATIONS

The present patent application is a National Stage under 35 USC 365 and claims priority to PCT International Application No. PCT/EP2006/050048, filed Jan. 5, 2006, incorporated herein by reference, which claims priority from German Application No.: 10 2005 003 984.7, filed Jan. 28, 2005.

FIELD OF THE INVENTION

The invention relates to a gas inlet element for a CVD reactor with a chamber, which has a multiplicity of outlet openings at the bottom, through which a process gas introduced into the chamber via access openings at the periphery exits into a process chamber of the CVD reactor.

The invention also relates to a CVD reactor formed with a gas inlet element of this type.

BACKGROUND

A generic gas inlet element is already known from EP 1 252 363 B1 and from EP 0 687 749 A1. The known gas inlet elements have a number of chambers arranged one above the other, which are respectively connected by a multiplicity of channels to the chamber bottom, so that the various process gases that are introduced into the chambers can exit from the bottom of the gas inlet element out of the openings in a distributed manner. The gases thereby enter a process chamber disposed underneath the bottom of the gas inlet element, the bottom of which is formed by a substrate holder on which there lie one or more substrates, which are coated by means of the components introduced into the process chamber by the process gases. The known gas inlet elements are used for MOCVD.

Metal Organic Chemical Vapor Deposition (MOCVD) is a widely used method for depositing single- or multi-component oxidic insulating layers (dielectrics), semiconductor layers, passivation layers or electrically conducting layers. For this purpose, a number of reactive gases or gaseous precursors are mixed, fed to a reaction chamber in order to deposit a layer on a heated substrate, and then pumped out from the reaction chamber. Among the reactors there are various geometric forms, for example horizontal and vertical reactors. In the case of horizontal reactors, the substrate surface is parallel to the direction of flow of the mixed precursors and reactive gases. In vertical reactors, the corresponding gas mixture impinges vertically onto the substrate surface and flows off to the outer edges of the substrate before it leaves the reaction chamber. In general, rotation of the substrate can lead to an increase in the uniformity of the layer that is deposited.

In order to ensure homogeneous deposition on the substrate, thorough mixing of the various gaseous precursors or reactive gases must be ensured. In order to achieve this, there are methods by which the gas mixing is achieved at an early stage before introduction into the reaction chamber. This is suitable for precursors and reactive gases that are stable at the temperature and pressure in the gas distributor.

However, the precursors used are often very reactive: the byproducts produced in the gas phase reactions that occur lead to deposition on, and consequently progressive contamination of, gas-carrying parts upstream of the substrate, cause particle formation, and consequently particle coating of the substrate, change the reaction mechanisms on the substrate and reduce the efficiency of the growth process.

In the case of the known multi-chamber gas distributor (cf. also U.S. Pat. No. 5,871,586), the various gaseous components are supplied in separate chambers and fed directly to the substrate via a multiplicity of openings. The mixing is effected only in the region directly at the substrate. In the case of some processes for oxidic insulating layers (dielectrics), passivation layers or electrically conducting layers, it has been found that this type of mixing does not lead to sufficiently homogeneous layers on the substrate. For some applications, the requirement for the inhomogeneity of the deposited layers on the substrate surface is, for example, <+−1%.

Many gaseous metal-organic precursors are only stable as such within a small temperature range. Metal-organic precursors may contain at least one metal atom and/or also at least one semiconductor atom (such as for example Si, Ge). At temperatures that are too low, condensation takes place, at temperatures that are too high decomposition takes place even before mixing with other reactive gases. It is therefore necessary to keep the gas distributor at a homogeneous temperature.

It is an object of the invention to provide measures that improve the way in which a generic gas inlet element operates.

The object is achieved by the invention specified in the claims, each of the claims in principle respectively representing an independent solution and it being possible in principle for each claim to be combined with any other claim or with any feature of any other claim.

Claim 1 provides first and foremost that the access openings are preceded by at least one mixing chamber arrangement, in which at least two process gases are mixed with one another. As a result of this configuration, the gases are already mixed when they are introduced into the central chamber of the gas inlet element, where they can then enter the process chamber from the outlet openings at the bottom in the mixed state. It has been found to be advantageous if the chamber is surrounded by an annular distribution channel. This annular distribution channel has a multiplicity of access openings, which are directed at the central chamber of the gas inlet element and from which the already mixed process gases flow into the central chamber. The central chamber may have a circular disk-shaped form. The annular distribution channel then surrounds the chamber in the form of a circular annulus. In a development, it is provided that the gas flow exiting from the mixing chamber arrangement is directed into the annular distribution channel. For this purpose, gas flow directing means may be provided, which in the simplest case are formed as strips of sheet metal. These protrude into the annular distribution channel in the manner of blades, in order to impart a certain inflow direction to the gas flow. In a preferred development, there are a multiplicity of mixing chamber arrangements, disposed substantially in uniform circumferential distribution. Preferably, a number of mixing chamber arrangements, in particular at least four and preferably six, are connected in uniform angular distribution to the annular distribution channel. These mixing chambers lie radially on the outside. In a development of the invention, it is provided that the mixing chamber arrangement consists of two or more chambers. Supply lines for a respective process gas open out into each of the two chambers. In this case, only one chamber may be connected directly to the annular distribution channel or to the central chamber. The two chambers are preferably separated by means of a gas-permeable separating wall. It is possible, for example, for the second process gas, introduced into the second chamber of the mixing chamber arrangement, to flow through this separating wall into the first chamber of the mixing chamber arrangement, in order then to flow together with the first process gas into the annular distribution channel. The gas-permeable separating wall is preferably formed by a perforated plate, which is exchangeable, so that it can be matched to the respective process taking place in the process chamber. The gas-permeable separating wall is preferably a continuation of the gas flow directing means. It is regarded as advantageous that one or more gaseous precursors and one or more chemically reactive gases are introduced separately into the mixing chamber arrangement and mixed there in at least one mixing chamber arrangement. After leaving the at least one mixing chamber arrangement, the gases flow in a circumferential direction into the annular distribution channel. After that, they flow via openings in a radial direction into the interior space of the gas inlet element. The interior space of the gas inlet element is provided with a multiplicity of outlet openings. From these openings, disposed in the manner of a shower head, the gas mixture flows into the process chamber. Preferably, at least four mixing chamber arrangements are provided. Each mixing chamber has preferably a reaction gas chamber, into which a chemically reactive gas is introduced. It also has at least one precursor chamber, into which at least one gaseous precursor is introduced. The gas outlet from the mixing chamber arrangement into the annular distribution channel is effected preferably via the precursor chamber. The precursor may contain a metallic component, the reactive gas oxygen or nitrogen. The gases exit from the outlet openings in the bottom of the central chamber homogeneously. The annular distribution channel may be formed by an annular groove in a metal plate, which is provided with a multiplicity of recesses which form the central chamber and the individual chambers of the mixing chamber arrangements. The temperature of the gas distributor can also be controlled. The coating process operated in the process chamber preferably takes place at a process pressure of from 0.001 Pa to 5 bar. The openings within the gas inlet element are formed such that they do not have any dead volume. Therefore, the chambers of the mixing chamber arrangement also have rounded walls. The dwell time of the gases in the respective mixing chamber and up to the annular distribution channel is less by a multiple than the dwell time of the gases in the central chamber of the gas inlet element. At room temperature, the precursors may be liquid or solid metal-organic starting materials or metal-organic liquid or solid starting materials that are dissolved in liquid or solid solvents. These are vaporized for conversion into the gas phase. This vapor is then fed to the process chamber via the gas inlet element. This may take place with the aid of one or more inert carrier gases. It is also possible to use precursors that are already in gas form at room temperature and are fed directly to the gas distributor. This may also take place with an inert carrier gas. Oxygen compounds are used in particular as the chemically reactive gas. They may comprise O2, O3, N2O or H2O. However, nitrogen compounds, in particular NH3, may also be used as reactive gases. The chemically reactive gases may also be hydrogen compounds. N2, H2, helium, argon or any other noble gas or inert gas come into consideration in particular as carrier gases. In the CVD reactor, which is equipped with a gas inlet element of this type, preferably multi-component oxidic insulating layers (dielectrics), passivation layers, semiconducting layers or electrically conducting layers and layer sequences are produced on at least one substrate. The precursors (starting materials) preferably comprise a metallic or semiconducting component.

BRIEF DESCRIPTION OF THE DRAWINGS

The invention is explained below on the basis of accompanying drawings, in which:

FIG. 3 shows a plan view of the gas distributor with the cover removed, FIG. 4 shows a detail the line IV-IV in FIG. 3, FIG. 5 shows a CVD reactor with a gas inlet element in a highly schematic representation and FIG. 6 shows a representation according to FIG. 4, the mixing chamber 11 having a modified cross-sectional contour.

DETAILED DESCRIPTION

Figure 1:
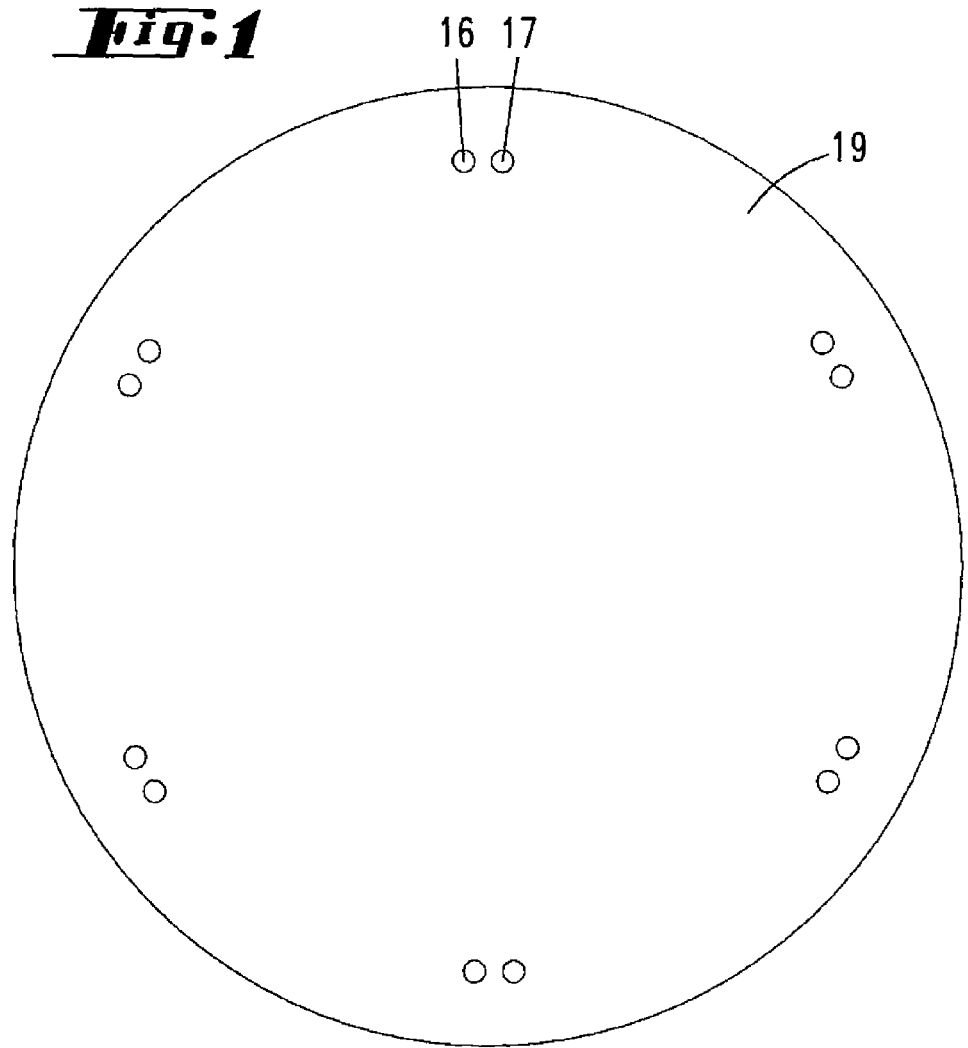
FIG. 1 shows the plan view of the cover part of a gas distributor of the exemplary embodiment.

The invention relates to an apparatus and a method for depositing single- or multi-component layers and layer sequences using a gas distributor 2. In this apparatus, gaseous precursors and reactive gases are introduced separately into a gas distributor 2. The gaseous precursors and reactive gases are mixed while still in the gas distributor 2, in order to achieve a high degree of mixing. The dwell time of the gases in the gas distributor 2 is kept low, in order to avoid gas phase reactions in the gas distributor 2. The gas distributor 2 has a high degree of temperature homogeneity, in order to avoid condensation, decomposition or preliminary reaction of the precursors with the chemically reactive gases. The gaseous precursors and the reactive gases are kept separate up until the mixing in mixing chambers 11, 12, in which the mixing takes place at lowest possible pressure and at the latest time possible, in order to avoid particle formation as much as possible. In this respect, the smallest possible pressure drop on passing through the gas distributor 2 is advantageous for the gaseous precursors. This is in particular the case when an upstream evaporator (not represented) is used to convert the precursors into the gas phase. For high gas phase saturation with precursors, the dwell time, temperature homogeneity and the pressure drop are particularly important.

The mixing chambers 11, 12 are arranged in a circumferential direction around an annular distribution channel 14, which is separated from the interior space of the gas distributor by an annular wall 22 provided with openings 10. The interior space 4 of the gas distributor is separated from the reaction chamber 21, in which the substrates are located, by a gas distributor wall provided with openings 23.

After leaving the mixing chambers 11, 12, the gas mixture is mixed further in the annular distribution channel 14 and flows in a radial direction symmetrically into the interior space 4 of the gas distributor. A homogeneous concentration at every point of the annular distribution channel 14 is achieved by the mixing arrangement/method described here. When the process gas mixture flows into the interior space 4 of the gas distributor, no concentration gradients arise in a radial direction. It would not be possible to compensate for these by substrate rotation. However, the gas distributor 2 is designed in such a way that in some applications there is no need for substrate rotation. The pressure drop over the gas distributor wall is small and makes it possible for the gas mixture to flow out uniformly from the interior space of the gas distributor to the reaction space.

The reactor arrangement represented in FIG. 5 has a reactor housing 1, which is shielded from the outside in a vacuumtight manner. The process gases flow into the reactor housing through separate supply lines 8, 9. They thereby flow into a gas inlet element 2, which is disposed in the reactor housing 1 and is located above a substrate holder 3. Together with the underside of the gas inlet element 2, this susceptor 3 forms the process chamber 21, into which the process gases are introduced after they have been mixed in the gas inlet element 2, in order to condense on substrates that are resting on the susceptor. The susceptor 3 can be rotated. The drive shaft 5 serves for this purpose. The loading of the process chamber 21 is performed via a loading/unloading opening 6. The waste gases are pumped away through the gas outlet 7.

Figure 2:
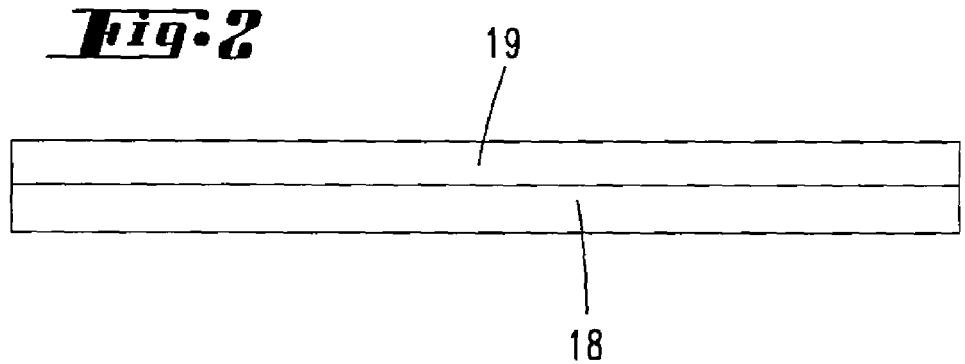
FIG. 2 shows a side view of the gas distributor according to FIG. 1.

FIGS. 1 to 6 show the detailed construction of the gas inlet element 2. The gas inlet element substantially consists of two metal plates 18, 19 disposed one above the other. The metal plate 19 forms a cover part. This has pairs of supply lines 16, 17, by which the process gases can be introduced separately from one another into the gas inlet element 2. The number of pairs of supply lines 16, 17 corresponds to the number of mixing chambers.

In this case, the supply lines 16, 17 respectively open out into inlet chambers 11, 12, which, together with a separating wall 13 separating them, form a mixing chamber arrangement.

A total of six mixing chamber arrangements 11, 12, 13 are provided in uniform circumferential distribution. These are formed as recesses in the bottom plate 18. The bottom plate 18 additionally forms a central chamber 4, which serves as a gas distributing chamber. It has a multiplicity of bottom openings disposed in the manner of a screen; these bottom openings form the outlet openings 23 for the mixed process gas.

The central gas distributing chamber 4 is surrounded by an annular channel 14, which serves for distribution of the gas. The annular channel 14 is formed by a groove. The groove wall 22, which separates the annular distribution channel 14 from the chamber 4, has a multiplicity of through openings 10 extending in a radial direction. Through these, the mixed gas can then flow out of the annular channel 14 into the central chamber 4.

Each mixing chamber arrangement has a first inlet chamber 11, into which the supply line 16, which is connected to the supply line 8, opens out. Through these supply lines a carrier gas, which carries a precursor, flows into the inlet chamber 11. The inlet chamber 11 has a rounded wall 11'. The opening where the inlet chamber 11 opens out into the outlet 24 has a slight constriction. The chamber 11 is directly connected to the annular distribution channel 14 via the outlet 24.

Lying opposite the chamber 11 in the circumferential direction is a second inlet chamber 12, into which the supply line 17, which is connected to the supply line 9, opens out. Through this supply line, a reactive gas is conducted into the inlet chamber 12. The wall 12' of the inlet chamber 12 is also rounded. Unlike the inlet chamber 11, however, the inlet chamber 12 is not directly connected to the annular distribution channel 14. Between the outlet 24 or the inlet chamber 11 and the inlet chamber 12 there is a separating wall 13, which consists of a perforated strip of sheet metal, so that the reactive gas 12 can flow through the holes in the separating wall 13 into the outlet 24.

Upstream of the opening of the outlet channel 24 there is a gas flow directing means 15. This is a bent piece of sheet metal, which makes the gas flowing out of the outlet 24 flow in the direction of the circumferential extending annular distribution channel 14. The gas flow directing means is a continuation of the separating wall 13. Separating wall 13 and gas flow directing means 15 are located on a mounting lug 20, which extends along the outer wall of the annular distribution channel 14. This sheet-metal part, comprising the parts 13, 15 and 20, is exchangeable. Exchange can be effected by the two metal plates 18, 19 being separated from each other.

The blade-shaped end of the gas flow directing means 15 extends approximately in the middle of the channel 14 that surrounds the chamber 4 and is formed by a groove.

In the case of the exemplary embodiment represented in FIG. 4, two mixing chambers have, at least in certain regions, parallel walls, which are connected to each other by means of a semicircular rear wall 11', 12'. In the case of the exemplary embodiment represented in FIG. 6, only the mixing chamber 12 has two parallel wall portions, which are connected to each other by means of an arcuate portion 12'. The mixing chamber 11 has a wall in the form of an arc extending over more than half a circle. This has the effect of forming a constriction.

All disclosed features are (in themselves) pertinent to the invention. The disclosure content of the associated/accompanying priority documents (copy of the prior application) is also hereby incorporated in full in the disclosure of the application, including for the purpose of incorporating features of these documents in claims of the present application.

The invention claimed is:

1. A gas inlet element (2) for a CVD reactor, said gas inlet element having a chamber (4), which chamber has a multiplicity of outlet openings (23) at a bottom thereof, through which outlet openings a process gas introduced into the chamber (4) via access openings (10) at a periphery of the chamber exits into a process chamber (21) of the CVD reactor (1), characterized in that the access openings (10) are preceded in a gas flow direction by a multiplicity of mixing chamber arrangements (11, 12, 13), disposed in substantially uniform circumferential distribution about the chamber (4), and in each of which at least two process gases are mixed with one another.

2. A gas inlet element according to claim 1, further including an annular distribution channel 14), which surrounds the chamber (4) and is flow-connected to the chamber (4) via the access openings (10), said access openings disposed substantially in equal circumferential distribution around the annular distribution channel.

3. A gas inlet element according to claim 2 characterized in that a gas flow exiting from the mixing chamber arrangements (11, 12, 13) is introduced in a directed manner into the annular distribution channel (14).

4. A gas inlet element according to claim 3 characterized in that the gas flow is directed into the annular distribution channel via gas flow directing means (15).

5. A gas inlet element according to claim 2 characterized in that the gas distributing chamber (4), has the outlet openings (23) at a bottom thereof, the annular distribution channel (14), surrounds said distributing chamber (4), and two chambers (11, 12) of the mixing chamber arrangement are formed by recesses in a metal plate (18), of the distributing chamber (14) over which there engages a cover part (19), which forms supply lines (16, 17) to the chambers (11, 12) of the gas mixing arrangement.

6. A gas inlet element according to claim 2 characterized in that the openings (10) in the annular distribution channel are located in a half of a height of a wall of the annular groove that is remote from a wall of the gas inlet element.

7. A gas inlet element according to claim 1 characterized in that the mixing chamber arrangement (11, 12, 13) has a first chamber (11), into which a supply line (16) for a first one of the process gasses opens out, and a second chamber (12), into which a supply line (17) for a second one of the process gasses opens out, the first and second chambers being separated from each other by a gas-permeable separating wall (13).

8. A gas inlet element according to claim 7 characterized in that the first chamber (11) is open toward an annular distribution channel (14) and the second chamber (12) is closed toward the annular distribution channel (14).

9. A gas inlet element according to claim 7 characterized in that the gas-permeable separating wall (13) is a perforated plate.

10. A gas inlet element according to claim 9 characterized in that the separating wall (13) and a gas flow directing means (15) are formed by an element which is exchangeably associatable with the mixing chamber arrangement (11, 12, 13).

11. A gas inlet element according to claim 7 characterized in that the gas-permeable separating wall (13) is a continuation of the a gas flow directing means (15) which introduces a gas flow exiting from the mixing chamber arrangement (11, 12, 13) into an annular distribution channel (14) in a directed manner.

12. A gas inlet element according to claim 1 characterized in that a temperature of the gas inlet element is controlled and said element has around its interior space an annular distribution channel (14) and the mixing chamber arrangements (11, 12, 13) a periphery with a thermal mass for temperature homogenization.

13. A method for use of a gas inlet element (2) configured according to any one of the preceding claims 1-4, 7-12 in a CVD reactor, in which method: a gaseous precursor, containing a metallic or semiconducting component, is introduced into the mixing chamber arrangement (11, 12, 13) and a reactive gas, containing an oxygen, nitrogen, or hydrogen compound, is introduced into the mixing chamber arrangement (11, 12, 13); the precursor and the reactive gas are mixed in the mixing chamber arrangement (11, 12, 13), flows from mixing chamber arrangement through the access openings (10) at the periphery of the chamber (4), and into the chamber (4); and flows from the chamber (4) through the outlet openings (23) and into the process chamber (21) of the CVD reactor.

14. A CVD reactor with a process chamber (21) for coating at least one substrate carried by a substrate holder, characterized in that process gases are introduced into the process chamber by means of a gas inlet element (2) configured according to any one of claims 1-4, 7-12.

* * * * *